(12) United States Patent
Lim et al.

(10) Patent No.: US 12,745,618 B2
(45) Date of Patent: Sep. 22, 2026

(54) SEMICONDUCTOR DEVICE COMPRISING NON-OXIDIZING MATERIAL

(71) Applicant: SAMSUNG ELECTRONICS CO., LTD., Suwon-si (KR)

(72) Inventors: Seungmin Lim, Suwon-si (KR); Jinnam Kim, Suwon-si (KR); Jongmin Baek, Suwon-si (KR); Hyoseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 333 days.

(21) Appl. No.: 18/382,545

(22) Filed: Oct. 23, 2023

(65) Prior Publication Data

US 2024/0266257 A1 Aug. 8, 2024

(30) Foreign Application Priority Data

Feb. 2, 2023 (KR) ........................ 10-2023-0014074

(51) Int. Cl.

| | |
|---|---|
| ***H10W 20/20*** | (2026.01) |
| ***H10D 30/43*** | (2025.01) |
| ***H10D 30/67*** | (2025.01) |
| ***H10D 62/10*** | (2025.01) |

(52) U.S. Cl.

CPC ............ *H10W 20/20* (2026.01); *H10D 30/43* (2025.01); *H10D 30/6729* (2025.01); *H10D 30/6735* (2025.01); *H10D 30/6757* (2025.01); *H10D 62/121* (2025.01)

(58) Field of Classification Search

None

See application file for complete search history.

(56) References Cited

U.S. PATENT DOCUMENTS

| | | | |
|---|---|---|---|
| 6,833,306 | B2 | 12/2004 | Lyding et al. |
| 6,975,019 | B2 | 12/2005 | Hazama |
| 7,378,335 | B2 | 5/2008 | Walther et al. |
| 8,445,969 | B2 | 5/2013 | Chen et al. |

(Continued)

FOREIGN PATENT DOCUMENTS

| | | |
|---|---|---|
| CN | 111326499 | 6/2020 |
| KR | 10-1547342 | 6/2010 |

*Primary Examiner* — Nduka E Ojeh

(74) *Attorney, Agent, or Firm* — Morgan, Lewis & Bockius LLP

(57) ABSTRACT

A semiconductor device includes a substrate having a front surface including an active region and a rear surface opposite to the front surface. An active pattern is on the active region. A gate structure extends in a second direction on the active region. Source/drain regions are disposed on the active pattern on both sides of the gate structure. A front interconnection structure is disposed on the gate structure and the source/drain regions. A rear interconnection structure is disposed on the rear surface of the substrate. A target region defined by the source/drain regions and the active pattern includes a non-oxidizing material at a first concentration. The non-oxidizing material is injected during a high-pressure heat treatment process. A rear interconnection region defined by the substrate, the rear through-structure, and the rear interconnection structure includes the non-oxidizing material at a second concentration higher than the first concentration.

20 Claims, 14 Drawing Sheets

(56) References Cited

U.S. PATENT DOCUMENTS

| | | | | |
|---|---|---|---|---|
| 8,741,710 | B2 | 6/2014 | Shin et al. | |
| 9,773,697 | B2 | 9/2017 | Tsukiyama et al. | |
| 10,950,447 | B2 | 3/2021 | Luan et al. | |
| 11,094,785 | B2 | 8/2021 | Majhi et al. | |
| 11,355,410 | B2 | 6/2022 | Huang et al. | |
| 2006/0270192 | A1* | 11/2006 | Cheng | H10D 30/6758 438/459 |
| 2012/0142160 | A1* | 6/2012 | Han | H01L 21/28176 438/585 |
| 2018/0145030 | A1 | 5/2018 | Beyne et al. | |
| 2019/0103277 | A1 | 4/2019 | Luan et al. | |
| 2020/0266169 | A1 | 8/2020 | Kang et al. | |
| 2020/0286996 | A1* | 9/2020 | Majhi | H10D 30/43 |
| 2021/0134721 | A1 | 5/2021 | Chiang et al. | |
| 2021/0202385 | A1 | 7/2021 | Huang et al. | |
| 2021/0335690 | A1* | 10/2021 | Huang | H10D 1/20 |

* cited by examiner

SEMICONDUCTOR DEVICE COMPRISING NON-OXIDIZING MATERIAL

CROSS-REFERENCE TO RELATED APPLICATION

This application claims priority under 35 U.S.C. § 119 to Korean Patent Application No. 10-2023-0014074, filed on Feb. 2, 2023 in the Korean Intellectual Property Office, the disclosure of which is incorporated by reference in its entirety herein.

1. TECHNICAL FIELD

The present inventive concept relates to a semiconductor device.

2. DISCUSSION OF RELATED ART

The integration level of semiconductor devices has increased as a demand for high performance, high speed, and/or multifunctionality of semiconductor devices has increased. Research is being conducted to increase the electrical performance of highly-integrated integrated circuit devices by injecting deuterium into an interface of a channel region by a high-pressure heat treatment process.

SUMMARY

An aspect of the present inventive concept is to provide a highly integrated, high-performance semiconductor device.

According to an embodiment of the present inventive concept, a semiconductor device includes a substrate having a front surface having an active region and a rear surface opposite to the front surface. An active pattern extends in a first direction on the active region of the substrate. A gate structure extends in a second direction on the active region of the substrate.

The gate structure crosses the active pattern. Source/drain regions are disposed on the active pattern on both sides of the gate structure. A front interconnection structure is disposed on the gate structure and the source/drain regions. The front interconnection structure is electrically connected to the gate structure. A rear interconnection structure is disposed on the rear surface of the substrate. The rear interconnection structure is electrically connected to the source/drain regions. A first contact plug electrically connects the gate structure and the front interconnection structure to each other. A second contact plug is disposed between the source/drain regions and the front interconnection structure. The second contact plug is electrically connected to the source/drain regions. A rear through-structure extends in a third direction perpendicular to the rear surface of the substrate. The rear through-structure electrically connects the second contact plug and the rear interconnection structure to each other. A target region defined by the source/drain regions and the active pattern includes a non-oxidizing material at a first concentration. The non-oxidizing material is injected during a high-pressure heat treatment process. A rear interconnection region defined by the substrate, the rear through-structure, and the rear interconnection structure includes the non-oxidizing material at a second concentration higher than the first concentration.

According to an embodiment of the present inventive concept, a semiconductor device includes a substrate having an active region. An active pattern is on the active region of the substrate. A gate structure is on the active region of the substrate. The gate structure crosses the active pattern. Source/drain regions are on the active pattern on both sides of the gate structure. A buried power rail is disposed on the substrate. The buried power rail is spaced apart from the source/drain regions. A contact plug is disposed on the source/drain regions. The contact plug electrically connects the source/drain regions and the buried power rail to each other. A rear interconnection structure is disposed below the substrate. The rear interconnection structure is electrically connected to the buried power rail. A concentration of deuterium increases towards a lower end of a rear interconnection region defined by at least a portion of the substrate and the rear interconnection structure. The deuterium is injected during a high-pressure heat treatment process.

According to an embodiment of the present inventive concept, a semiconductor device includes a substrate having an active region. An active pattern is on the active region of the substrate. A gate structure is on the active region of the substrate. The gate structure crosses the active pattern. Source/drain regions are on the active pattern on both sides of the gate structure. A front interconnection structure is disposed on the gate structure and the source/drain regions. The front interconnection structure is electrically connected to the gate structure. A first contact plug electrically connects the gate structure and the front interconnection structure to each other. A buried power rail is disposed on the substrate. The buried power rail is spaced apart from the source/drain regions. A rear interconnection structure is disposed below the substrate. The rear interconnection structure is electrically connected to the buried power rail. A second contact plug is disposed on the source/drain regions. The second contact plug electrically connects the source/drain regions and the buried power rail to each other. Deuterium is included in a target region defined by the source/drain regions and the active pattern, a rear interconnection region defined by the rear interconnection structure, a contact region defined by the second contact plug, and front interconnection regions defined by the front interconnection structure. The deuterium is injected during a high-pressure heat treatment process. A concentration of the deuterium increases towards an upper end of the front interconnection region and a lower end of the rear interconnection region.

BRIEF DESCRIPTION OF DRAWINGS

The above and other aspects, features, and advantages of embodiments of the present inventive concept will be more clearly understood from the following detailed description taken in conjunction with the accompanying drawings, in which.

DETAILED DESCRIPTION OF EMBODIMENTS

Figure 1:
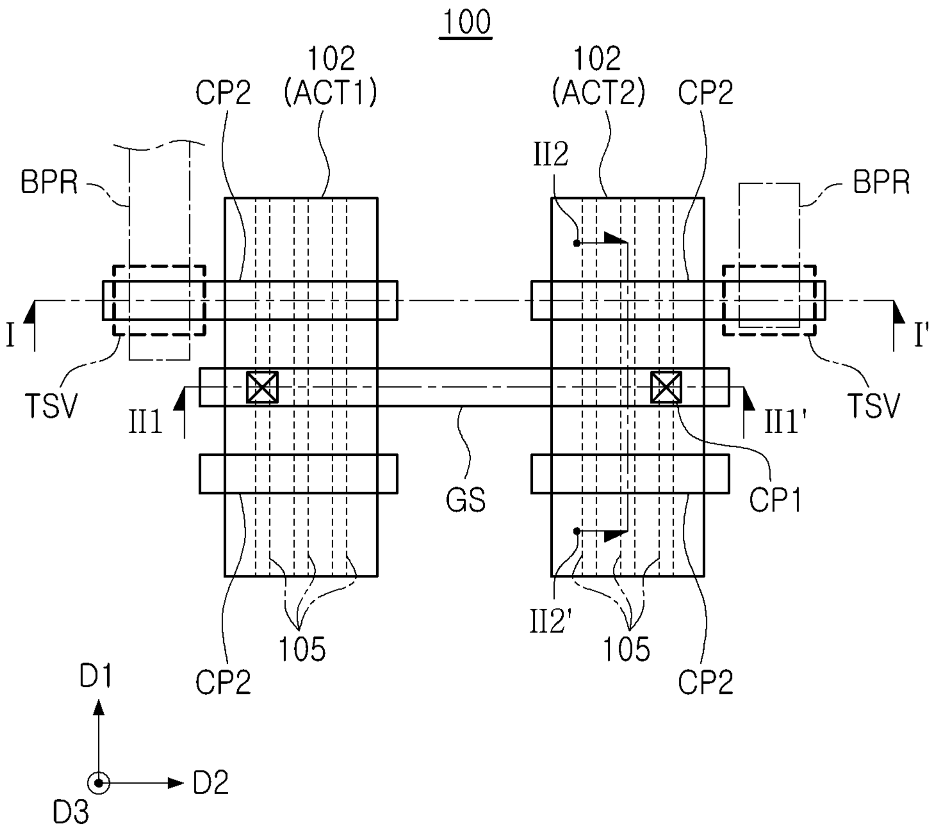
FIG. 1 is a layout diagram of a semiconductor device according to an embodiment of the present inventive concept.

Hereinafter, non-limiting embodiments of the present inventive concept will be described with reference to the accompanying drawings. Hereinafter, terms such as 'an upper side, 'an upper portion,' 'an upper surface,' a lower side, a lower portion, a lower surface, and the like, may be understood as referring to the drawings, and in fact, may vary depending on a direction in which the components are disposed.

Figure 2A:
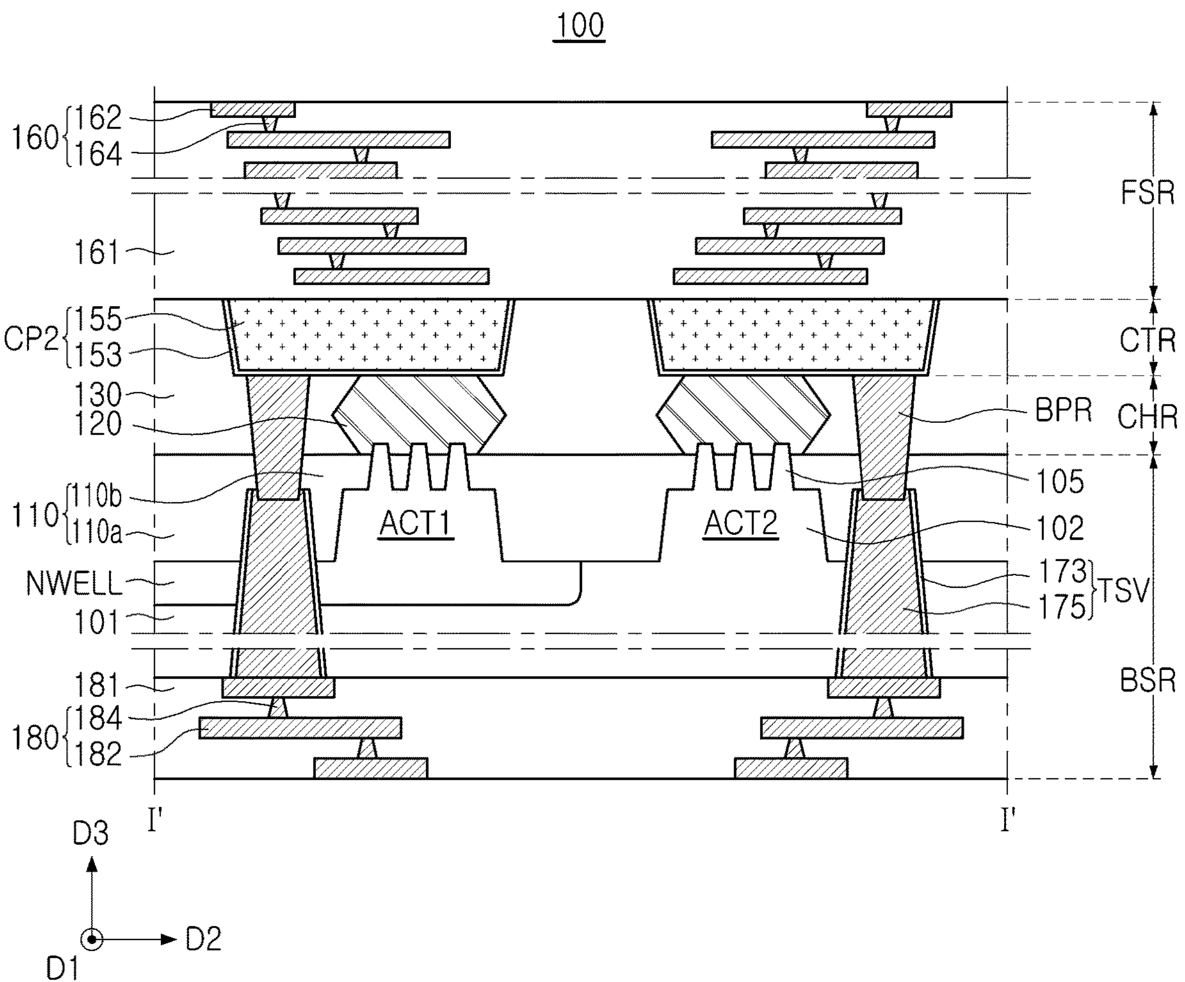
FIGS. 2A and 2B are cross-sectional views illustrating cross-sections taken along lines II', II1-II1' and II2-II2' of FIG. 1.
Figure 2B:
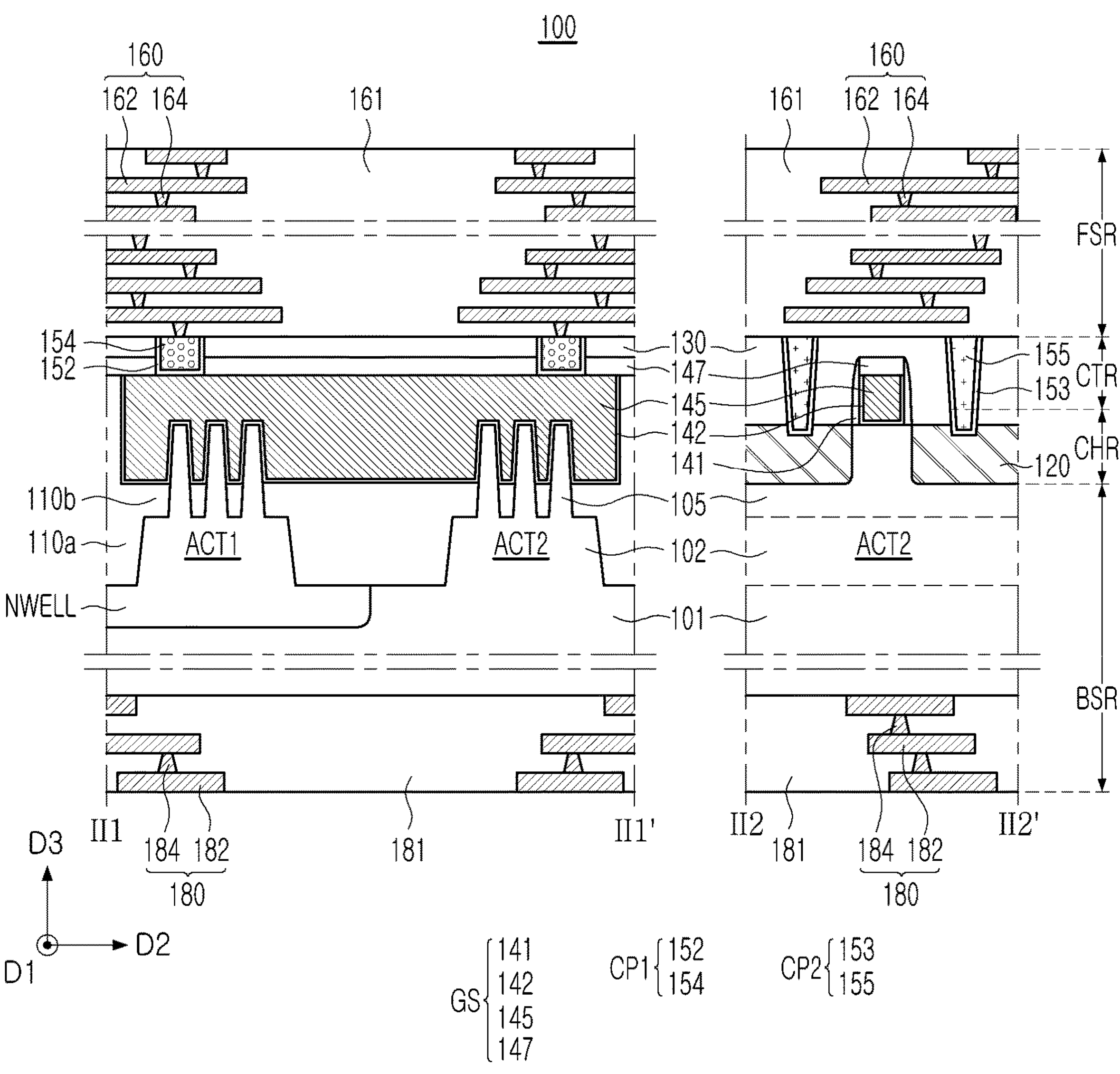
Figure 2C:
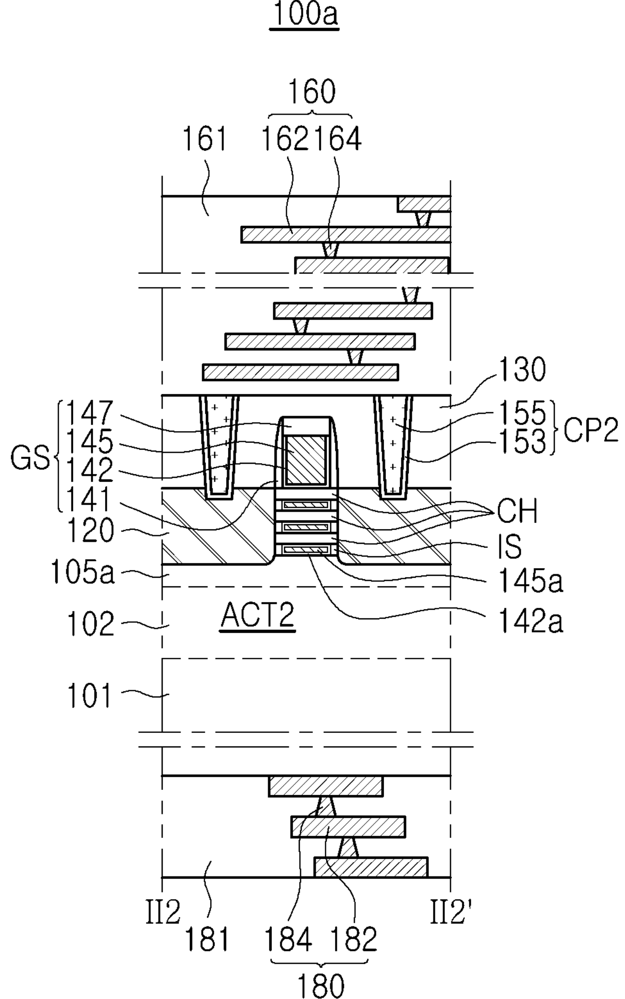
FIG. 2C is a cross-sectional view illustrating a semiconductor device of an embodiment.

FIG. 1 is a layout diagram of a semiconductor device 100 according to an embodiment of the present inventive concept, FIGS. 2A and 2B are cross-sectional views illustrating cross-sections taken along lines I-I', II1-II1', and II2-II2' of FIG. 1, and FIG. 2C is a cross-sectional view illustrating a semiconductor device 100*a* of an embodiment. FIG. 1 is a plan view illustrating a disposition of some elements constituting integrated circuit elements.

Referring to FIGS. 1, 2A, and 2B, the semiconductor device 100 according to an embodiment may include a fin field effect transistor (FinFET) device. The FinFET device may constitute a logic cell. The logic cell may be configured in various manners, including a plurality of circuit elements such as transistors and resistors. In an embodiment, the logic cell may constitute, for example, AND, NAND, OR, NOR, exclusive OR (XOR), exclusive NOR (XNOR), inverter (INV), adder (ADD), buffer (BUF), delay (DLY), filter (FIL), multiplexer (MXT/MXIT), OR/AND/INVERTER (OAI), AND/OR (AO), AND/OR/INVERTER (AOI), D flip-flop, reset flip-flop, master-slave flip-flop, latch, and the like, and the logic cell may constitute standard cells that perform desired logical functions such as counters and buffers.

The semiconductor device 100 according to an embodiment may include a substrate 101, an active pattern 105, a gate structure GS, source/drain regions 120, rear through-structures TSV and BPR, and a rear interconnection structure 180. The semiconductor device 100 may further include a front interconnection structure 160.

The substrate 101 may have a front surface extending in a first direction D1 and a second direction D2 and a rear surface opposite to the front surface. In an embodiment, the substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, an epitaxial layer, a Silicon On Insulator (SOI) layer, a Semiconductor On Insulator (SeOI) layer, or the like. In an embodiment, the substrate 101 may include doped regions such as an N well region NWELL.

The substrate 101 may include an active region 102 formed on a front surface. The active region 102 may be disposed to extend in the first direction D1. In some embodiments as shown in FIG. 2A, the active region 102 may include two active regions ACT1 and ACT2 of different conductivity types from each other. For example, in an embodiment the first active region ACT1 may be a p-type doped region having an n-type well, and the second active region ACT2 may be an n-type doped region having a p-type well PW. The active region 102 may be defined by a device isolation layer 110.

In an embodiment, the device isolation layer 110 may include, for example, a first isolation region 110*a* defining the active region 102 and a second isolation region 110*b* adjacent to the first isolation region 110*a* (e.g., in the second direction D2) and defining a plurality of fins constituting the active pattern 105. The first isolation region 110*a* has a deeper bottom surface than the second isolation region 110*b*. The first isolation region 110*a* may be referred to as deep trench isolation (DTI) having a first depth, and the second isolation region 110*b* may be referred to as shallow trench isolation (STI) having a second depth that is less than the first depth. A portion of the active pattern 105 may protrude above the second isolation region 110*b* (e.g., in the third direction D3) while penetrating through the second isolation region 110*b*. In some embodiments, the device isolation layer 110 may have a curved upper surface having a higher level toward the active pattern 105. In an embodiment, the device isolation layer 110 may be formed of an insulating material, and may include, for example, an oxide, nitride, or a combination thereof.

The active pattern 105 may extend in a first direction D1 on the active region 102, and protrude from the substrate 101 in a third direction D3. In an embodiment, an upper end of the active pattern 105 may be disposed to protrude from an upper surface of the device isolation layer 110 to a predetermined height. The active pattern 105 may be formed of a portion of the substrate 101, or may include an epitaxial layer grown from the substrate 101. For example, in an embodiment the active pattern 105 may include impurities diffused from the source/drain regions 120 in a region, in direct contact with the source/drain regions 120. The active pattern 105 may include at least one active fin protruding in the third direction D3. For example, in an embodiment as shown in FIG. 2A, the active pattern 105 may include three active fins extending in the first direction D1 from the active region 102, and arranged to be in parallel in the second direction D2. However, embodiments of the present inventive concept are not necessarily limited thereto and the number of active fins may be less than 3 or more than 3. According to an embodiment as shown in FIG. 2C, the active pattern 105 may not include an active fin shape, and in this embodiment, the active region 102 may have a relatively flat upper surface. The active pattern 105 may be partially recessed on both sides of the gate structure GS. Source/drain regions 120 may be disposed on the recessed active pattern 105.

Source/drain regions 120 may be disposed on the active pattern 105 on both sides of the gate structure GS. The source/drain regions 120 may serve as source regions or drain regions of transistors. As illustrated in FIG. 2B, upper surfaces of the source/drain regions 120 may be positioned at the same or a similar level (e.g., in the third direction D3) as a lower surface of the gate structure GS. However, relative heights of the source/drain regions 120 and the gate structures GS may be variously changed according to embodiments.

In an embodiment, the source/drain regions 120 may have a merged form connected to each other between adjacent active patterns 105 in the second direction D2, but the present inventive concept is not limited thereto. As illustrated in FIG. 2A, the source/drain regions 120 may have angular side surfaces in a cross-section thereof in the second direction D2. According to an embodiment, the source/drain regions 120 may have various shapes, for example, any one of a polygonal shape, a circular shape, an elliptical shape, a rectangular shape, etc.

In an embodiment, the source/drain regions 120 may be formed of an epitaxial layer and may include, for example, silicon (Si), silicon germanium (SiGe), or silicon carbide (SIC). In addition, the source/drain regions 120 may further include impurities such as arsenic (As) and/or phosphorus (P). In an embodiment, the source/drain regions 120 may include a plurality of regions including different concentrations of elements and/or doping elements.

The gate structure GS may cross the active pattern 105 above the active region 102 and extend in a second direction D2. Channel regions of transistors may be formed in the active pattern 105 crossing the gate structure GS. In an embodiment as shown in FIG. 2B, the gate structure GS may include a gate insulating film 142, a gate electrode 145, gate spacer layers 141, and a gate capping layer 147.

The gate insulating film 142 may be disposed between the active pattern 105 and the gate electrode 145. In some embodiments, the gate insulating film 142 may be formed of a plurality of layers, or may be disposed to extend onto a lateral side surface of the gate electrode 145. In an embodiment, the gate insulating film 142 may include an oxide, nitride, or a high-K material. The high-K material may refer to a dielectric material having a higher dielectric constant than silicon oxide ($SiO_2$).

In an embodiment, the gate electrode 145 may include a conductive material, for example, a metal nitride such as a titanium nitride (TIN), tantalum nitride (TaN), or tungsten nitride (WN), and/or a metal material such as aluminum (Al), tungsten. (W), or molybdenum (Mo), or a semiconductor material such as doped polysilicon. The gate electrode 145 may be composed of two or more multi-layers. In an embodiment, according to a circuit configuration of the semiconductor device 100, the gate electrode 145 may be disposed to be separated from each other in the second direction D2 between at least a portion of adjacent transistors. For example, in an embodiment the gate electrode 145 may be separated by a separate gate separation layer.

The gate spacer layers 141 may be disposed on both sides (e.g., lateral sides in the second direction D2) of the gate electrode 145. The gate spacer layers 141 may insulate the source/drain regions 120 and the gate electrode 145. In some embodiments, the gate spacer layers 141 may have a multi-layer structure. In an embodiment, the gate spacer layers 141 may include an oxide, nitride, and oxynitride, and particularly, may include low dielectric. For example, the gate spacer layers 141 may include at least one compound selected from SiO, SiN, SiCN, SiOC, SiON, and SiOCN. However, embodiments of the present inventive concept are not necessarily limited thereto.

The gate capping layer 147 may be disposed above the gate electrode 145 (e.g., directly thereabove in the third direction D3), and lower surfaces and lateral side surfaces of the gate capping layer 147 may be surrounded by the gate electrode 145 and the gate spacer layers 141, respectively. For example, the gate capping layer 147 may include an oxide, nitride, and oxynitride.

The interlayer insulating layer 130 may be disposed to cover the source/drain regions 120 and the gate structure GS. In an embodiment, the interlayer insulating layer 130 may include, for example, at least one material selected from an oxide, nitride, and oxynitride, and may include a low dielectric.

The front interconnection structure 160 may be disposed on the gate structure GS and the source/drain regions 120 (e.g., in the third direction D3), and is electrically connected to the gate structure GS through a first contact plug CP1. In an embodiment, the first contact plug CP1 may include a first conductive barrier 152 and a first conductive plug 154. In an embodiment, the first conductive barrier 152 may include at least one material selected from Ti, TiN, Ta, or TaN. The first conductive plug 154 may include a conductive material, for example, a metal material such as tungsten (W), aluminum (Al), or copper (Cu), or a semiconductor material such as doped polysilicon. The front interconnection structure 160 may be electrically insulated from the source/drain regions 120. For example, the front interconnection structure 160 may be spaced apart from a second contact plug CP2. A front dielectric layer 161 may be disposed between the front interconnection structure 160 and the second contact plug CP2 (e.g., in the third direction D3).

The front interconnection structure 160 may include front interconnection lines 162 and front vias 164. The front interconnection lines 162 and the front vias 164 may include at least one metal selected from, for example, W, Al, or Cu. In an embodiment, a barrier film may be formed between the front interconnection lines 162 and front vias 164 and the front dielectric layer 161. The barrier film may include at least one material selected from Ti, TiN, Ta, or TaN.

The front dielectric layer 161 may be formed to surround the front interconnection lines 162 and the front vias 164. The front dielectric layer 161 may be formed of a silicon oxide or a low-K material. For example, in an embodiment the front dielectric layer 161 may include at least one compound selected from SiO, SiN, SiCN, SiOC, SiON, and SiOCN. In an embodiment, the front dielectric layer 161 may be divided into a plurality of insulating layers disposed at the same level as the front interconnection lines 162 and the front vias 164, respectively. In this embodiment, etch stop layers may be disposed on a lower surface of each of the plurality of insulating layers. The etch stop layers may function as an etch stop layer in an etching process for forming the front interconnection lines 162 and the front vias 164. In an embodiment, the etch stop layers may include a high-k material, for example, a silicon nitride or aluminum oxide. According to an embodiment, the front dielectric layer 161 may further include a passivation layer (e.g., silicon nitride) covering an upper surface of the front interconnection structure 160.

The rear through-structures TSV and BPR may extend in the third direction D3 perpendicular to a rear surface of the substrate 101, and may electrically connect the second contact plug CP2 and the rear interconnection structure 180 to each other. In an embodiment, the rear through-structure TSV and BPR may include, for example, a buried power rail (BPR) and a through via (TSV).

The buried power rail BPR may be disposed between the through via TSV and the second contact plug CP2 (e.g., in the third direction D3), and may be spaced apart from the source/drain regions 120. In an embodiment, the buried power rail BPR may extend in the first direction D1. However, embodiments of the present inventive concept are not necessarily limited thereto. The buried power rail BPR may be buried at a level lower than that of the front interconnection structure 160, thereby increasing a degree of design freedom of the front interconnection structure 160.

The buried power rail BPR may be power lines supplying different potentials to the source/drain regions 120 through the second contact plug CP2. For example, in an embodiment the first power line may supply a first power source VDD, and the second power line may supply a second power source VSS, lower than the first power source VDD. In an embodiment, the buried power rail BPR may include, for example, at least one compound selected from aluminum (Al), copper (Cu), and tungsten (W).

The through via TSV may penetrate through the substrate 101, and extend in the third direction D3. In an embodiment as shown in FIG. 2A, the through via TSV may include a via plug 175 and a side barrier film 173. In an embodiment, the via plug 175 may be formed of, for example, W, Mo, Ru, Nb, Hf, or a combination thereof. The side barrier film 173 may be made of Ti, Ta, TiN, TaN, or a combination thereof.

The second contact plug CP2 may be disposed between the source/drain regions 120 and the front interconnection structure 160 (e.g., in the third direction D3), and may be electrically connected to the source/drain regions 120. For example, the second contact plug CP2 may electrically connect the source/drain regions 120 to the buried power rail BPR. The second contact plug CP2 may include a second conductive barrier 153 and a second conductive plug 155. In an embodiment, the second conductive barrier 153 may include at least one material selected from Ti, TiN, Ta, or TaN. The second conductive plug 155 may include a conductive material, for example, a metal material such as tungsten (W), aluminum (Al), or copper (Cu), or a semiconductor material such as doped polysilicon. The second contact plug CP2 may be formed to recess the source/drain regions 120 to a predetermined depth. However, embodiments of the present inventive concept are not necessarily limited thereto. According to an embodiment, the second contact plug CP2 may further include a metal-semiconductor layer such as a silicide layer disposed on an interface in direct contact with the source/drain regions 120. Similarly, the first contact plug CP1 may further include a metal-semiconductor layer such as a silicide layer disposed on an interface in contact with the gate electrode 145.

The rear interconnection structure 180 may be disposed on a rear surface of the substrate 101, and may be electrically connected to the source/drain regions 120. In an embodiment, the rear interconnection structure 180 may include rear interconnection lines 182 and rear vias 184. In an embodiment, the rear interconnection lines 182 and the rear vias 184 may include at least one metal selected from, for example, W, Al, or Cu. A barrier film may be formed between the rear interconnection lines 182 and the rear vias 184 and the rear dielectric layer 181. In an embodiment, the barrier film may include at least one material selected from Ti, TiN, Ta, or TaN.

The rear dielectric layer 181 may be formed to surround the rear interconnection lines 182 and the rear vias 184. In an embodiment, the rear dielectric layer 181 may be formed of silicon oxide or a low-K material. For example, the rear dielectric layer 181 may include at least one compound selected from SiO, SiN, SiCN, SiOC, SiON, and SiOCN. The rear dielectric layer 181 may be divided into a plurality of insulating layers disposed at the same level as the rear interconnection lines 182 and the rear vias 184, respectively. In this embodiment, etch stop layers may be disposed on an upper surface of each of the plurality of insulating layers. The etch stop layers may function as an etch stop layer in an etching process for forming the rear interconnection lines 182 and the rear vias 184. In an embodiment, the etch stop layers may include a high-K material, for example, a silicon nitride or aluminum oxide. According to an embodiment, the rear dielectric layer 181 may further include a passivation layer (e.g., silicon nitride) covering a lower surface of the rear interconnection structure 180.

Referring to FIG. 2C, according to an embodiment that is modified from FIG. 2B, the semiconductor device 100*a* may further include a plurality of channel layers CH disposed on the active region 102 to be vertically spaced apart from each other and inner spacer layers IS disposed between the plurality of channel layers CH and arranged to be parallel to the gate electrode layer 145*a*. In an embodiment, the semiconductor device 100*a* may include transistors of a gate-all-around type structure in which the gate electrode layer 145*a* and the gate insulating layer 142*a* are disposed between the active pattern 105*a* and the lowermost channel layer CH and between the plurality of channel layers CH of a shape of nanosheets. For example, the semiconductor device 100*a* may include transistors having a Multi Bridge Channel FET (MBCFET™) structure comprising a plurality of channel layers CH, source/drain regions 120, and a gate structure GS.

In an embodiment, the plurality of channel layers CH may include two or more channel layers CH disposed to be spaced apart from each other in a direction perpendicular to an upper surface of the active pattern 105 on the active region 102, for example, in a third direction D3. The plurality of channel layers CH may be spaced apart from the upper surface of the active pattern 105, while being connected to the source/drain regions S/D. In an embodiment, the channel layers CH may have the same or similar width as the active pattern 105 in the second direction D2, and may have the same or similar width as the gate structure GS in a first direction D1. However, embodiments of the present inventive concept are not necessarily limited thereto. For example, in an embodiment the channel layers CH may have a reduced width so that lateral side surfaces thereof are positioned below the gate structure GS.

In an embodiment, the plurality of channel layers CH may be formed of a semiconductor material, and may include, for example, at least one compound selected from silicon (Si), silicon germanium (SiGe), and germanium (Ge). The plurality of channel layers CH may be formed of, for example, the same material as that of the substrate 101. The number and shape of the channel layers CH are not necessarily limited to those shown in FIG. 2C and may be variously changed in some embodiments.

The gate structure GS may extend to cross the active pattern 105 and the plurality of channel layers 55 above the active pattern 105 and the plurality of channel layers CH. A channel region of transistors may be formed in the active pattern 105 and the plurality of channel layers CH crossing the gate structure GS. The gate electrode layer 145*a* may be disposed to fill a space between the plurality of channel layers CH above the active pattern 105*a* and extend to upper portions of the plurality of channel layers CH. The gate electrode layer 145*a* may be spaced apart from the plurality of channel layers CH by the gate insulating layer 142*a*.

The inner spacer layers IS may be arranged parallel to gate electrode layers 145*a* between the plurality of channel layers CH. The gate electrode layer 145*a* may be spaced apart from the source/drain regions 120 by the inner spacer layers IS, and electrically separated therefrom. In an embodiment, lateral side surfaces of the inner spacer layers IS facing the gate electrode layer 145*a* may be flat, or may have a convexly rounded shape inwardly toward the gate electrode layer 145*a*. In an embodiment, the inner spacer layers IS may be formed of a material selected from an oxide, nitride, and oxynitride, and particularly may be formed of a low dielectric constant film.

In an embodiment, by performing a high-pressure heat treatment process after the front interconnection structure 160 and the rear interconnection structure 180 are fabricated, it is possible to more effectively inject a non-oxidizing material into the target region CHR. In an embodiment, the non-oxidizing material may include hydrogen or deuterium. However, embodiments of the present inventive concept are not necessarily limited thereto. For example, the high-pressure heat treatment process may be performed in a deuterium atmosphere.

Interfacial defects between the channel region (e.g., the upper region of the active pattern 105) and the gate structure GS (e.g., the gate insulating film 142) may be passivated by deuterium, so that electrical characteristics may be increased. A concentration profile of deuterium injected by a high-pressure heat treatment process may be clearly checked by dividing the semiconductor device 100 according to an embodiment into a target region (CHR), a contact region (CTR), a front interconnection region (FSR), and a rear interconnection region (BSR). For example, the concentration of deuterium may increase toward a lower end of the rear interconnection region BSR. The target region CHR may include a non-oxidizing material (e.g., hydrogen or deuterium) at a first concentration, and the rear interconnection region BSR may include a non-oxidizing material (e.g., hydrogen or deuterium) at a second concentration, higher than the first concentration. The concentration of the non-oxidizing material (e.g., hydrogen or deuterium) may increase or decrease between the first concentration and the second concentration. Here, the target region CHR may be defined by the source/drain regions 120 and the active pattern 105. The contact region CTR may be defined by the second contact plug CP2. The rear interconnection region (BSR) may be defined by the rear through-structure (BPR, TSV) and the rear interconnection structure 180. The front interconnection region (FSR) may be defined by the front interconnection structure 160. Hereinafter, various concentration distributions of deuterium according to embodiments will be described with reference to FIGS. 3A to 7.

Figure 3A:
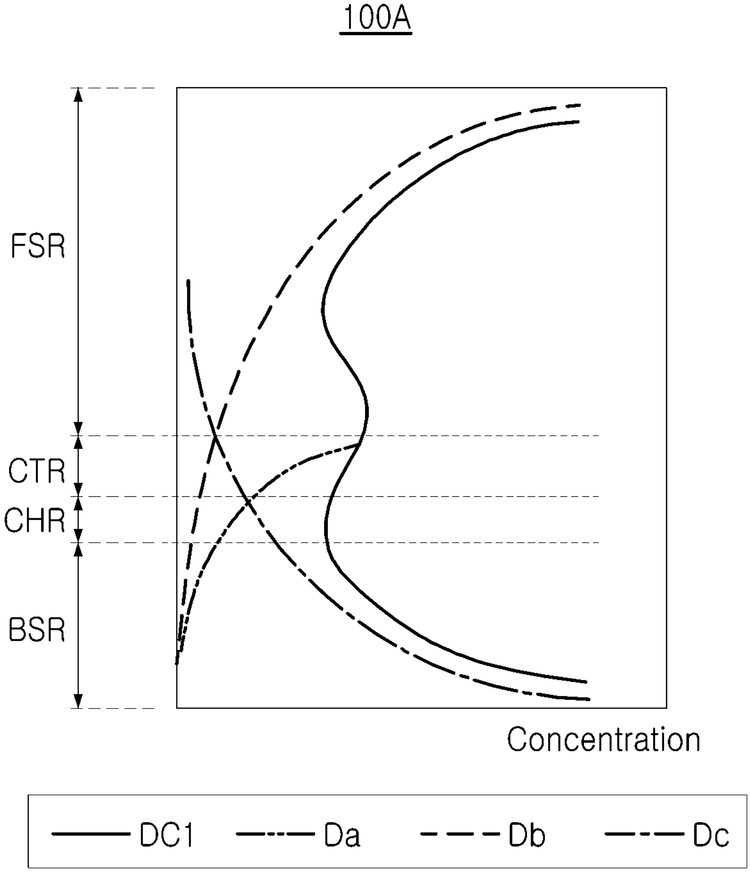
FIGS. 3A and 3B are concentration profiles of a non-oxidizing material in a semiconductor device according to an embodiment of the present inventive concept.
Figure 3B:
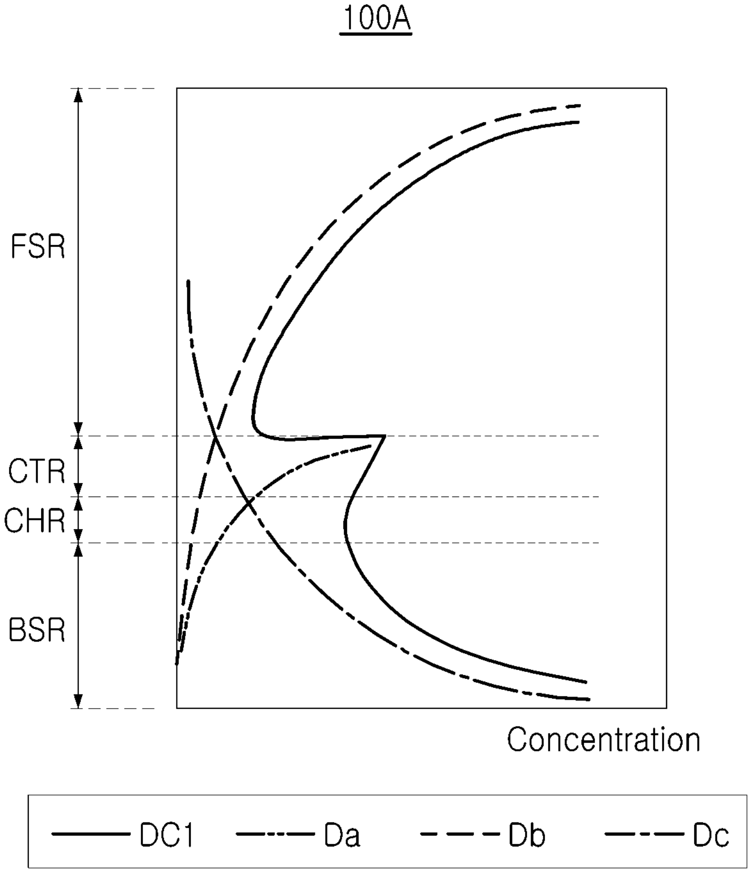
Figure 4A:
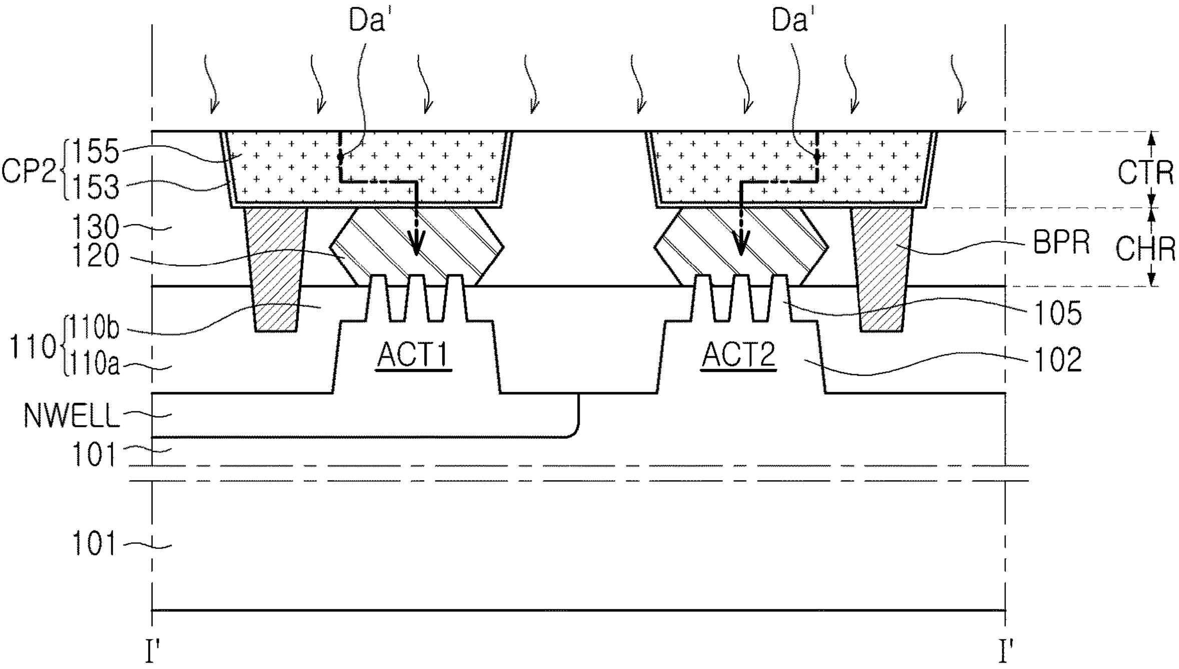
FIGS. 4A and 4B are cross-sectional views illustrating a manufacturing process of the semiconductor device having the concentration profile of FIG. 3A or 3B according to a high-pressure heat treatment process sequence.
Figure 4B:
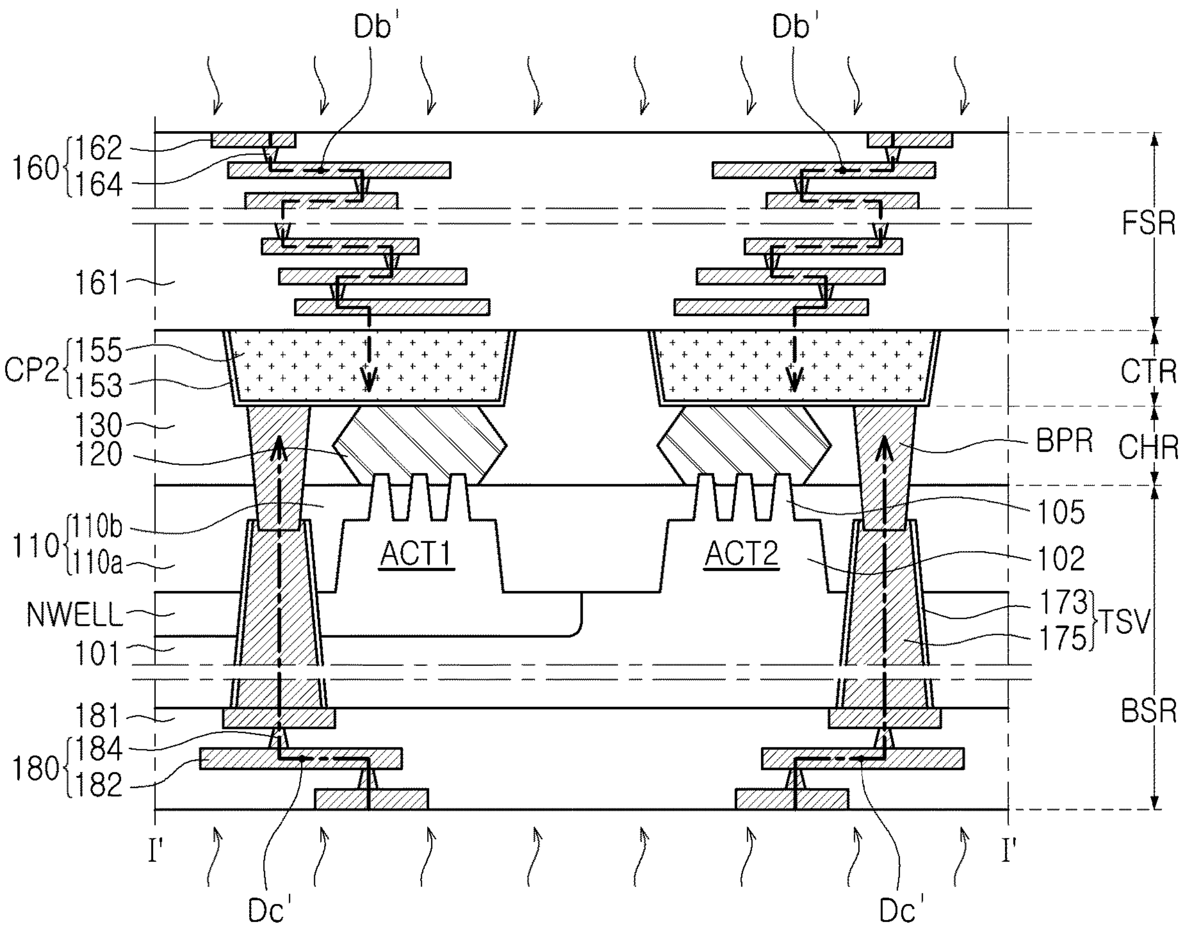

FIGS. 3A and 3B are concentration profiles DC1 of a non-oxidizing material in a semiconductor device 100A according to an embodiment of the present inventive concept, and FIGS. 4A and 4B are cross-sectional views illustrating a manufacturing process of the semiconductor device 100A having the concentration profile of FIG. 3A or 3B according to a high-pressure heat treatment process sequence.

Referring to FIGS. 3A, 3B, 4A, and 4B, the semiconductor device 100A according to an embodiment may have first concentration profiles DC1 for a non-oxidizing material (FIGS. 3A and 3B). According to the first concentration profiles DC1, the non-oxidizing material, such as deuterium, is included in all of a target region CHR, contact region CTR, front interconnection region FSR, and rear interconnection region BSR, and a concentration of deuterium may increase towards an upper end the front interconnection region FSR and a lower end of the rear interconnection region BSR. The first concentration profiles DC1 may be determined by a combination of a first preliminary concentration profile Da, a second preliminary concentration profile Db, and a third preliminary concentration profile Dc. According to the first concentration profiles DC1, the target region CHR may include a non-oxidizing material (e.g., hydrogen or deuterium) at a first concentration, and the rear interconnection region BSR may include a non-oxidizing material (e.g., hydrogen or deuterium) at a second concentration that is higher than the first concentration. The front interconnection region FSR may include a non-oxidizing material (e.g., hydrogen or deuterium) at a third concentration, higher than the first concentration.

As illustrated in FIG. 3A, the first concentration profile DC1 of an embodiment may have at least two inflection points along the third direction D3. In this embodiment, a first low-concentration point of the non-oxidizing material (e.g., hydrogen or deuterium) may be located in the front interconnection region FSR, and a second low-concentration point may be located in the contact region CTR or target region CHR. In FIG. 3A, it is illustrated that the second low-concentration point is located in the target region CHR. However, embodiments of the present inventive concept are not necessarily limited thereto and the second low-concentration point may be located in the contact region CTR or the rear interconnection region BSR in some embodiments. In addition, in FIG. 3A, it is illustrated that the first low concentration point and the second low concentration point have the same concentration as each other. However, embodiments of the present inventive concept are not necessarily limited thereto and the first low concentration point and the second low concentration point may have different concentrations from each other. For example, as illustrated in FIG. 3B, in the first concentration profile DC1 of an embodiment, the second low-concentration point in the target region CHR may have a higher concentration than the first low-concentration point in the front interconnection region FSR. The different low concentration points may be a result of a predominance of deuterium permeation through the rear interconnection region BSR as compared to the first concentration profile DC1 of FIG. 3A. As described above, vertical and horizontal positions of the first low-concentration point and the second low-concentration point may be variously modified.

In an embodiment, a manufacturing method of the semiconductor device 100A may include primary and secondary high-pressure heat treatment processes. As illustrated in FIG. 4A, the primary high-pressure heat treatment process may be performed after source/drain regions 120, a buried power rail BPR, and a second contact plug CP2 are formed on the substrate 101. In an embodiment, the primary high-pressure heat treatment process may be performed at a first temperature, for example, at about 1000° C. and in a non-oxidizing atmosphere. In the primary high-pressure heat treatment process, a non-oxidizing material (e.g., hydrogen or deuterium) may be injected into the target region CHR through a first path Da'. The non-oxidizing material injected into the first path Da' may be included in a highest concentration in the contact region CTR. For example, the first preliminary concentration profile Da of the non-oxidizing material injected into the first path Da' may have a form in which a concentration of the non-oxidizing material decreases from the contact region CTR to the rear interconnection region BSR.

As illustrated in FIG. 4B, the secondary high-pressure heat treatment process may be performed after a front interconnection structure 160 on a front surface of the substrate 101 and a rear interconnection structure 180 on a rear surface of the substrate 101 are formed. In an embodiment, the secondary high-pressure heat treatment process may be performed at a second temperature lower than the first temperature, for example, at a temperature in a range of about 300° C. to about 600° C. and in a non-oxidizing atmosphere. In the secondary high-pressure heat treatment process, the non-oxidizing material may be injected into the target region CHR through a second path Db' and a third path Dc'. In an embodiment, the non-oxidizing material injected into the second path Db' may be included in the highest concentration in the front interconnection region FSR. The second preliminary concentration profile Db of the non-oxidizing material injected through the second path Db' may have a form in which a concentration of the non-oxidizing material decreases from the front interconnection region FSR to the rear interconnection region BSR. The non-oxidizing material injected into the third path Dc' may be included in the highest concentration in the rear interconnection region BSR. The third preliminary concentration profile Dc of the non-oxidizing material injected through the third path Dc' may have a form in which the concentration of the non-oxidizing material decreases from the rear interconnection region BSR to the front interconnection region FSR.

Figure 5A:
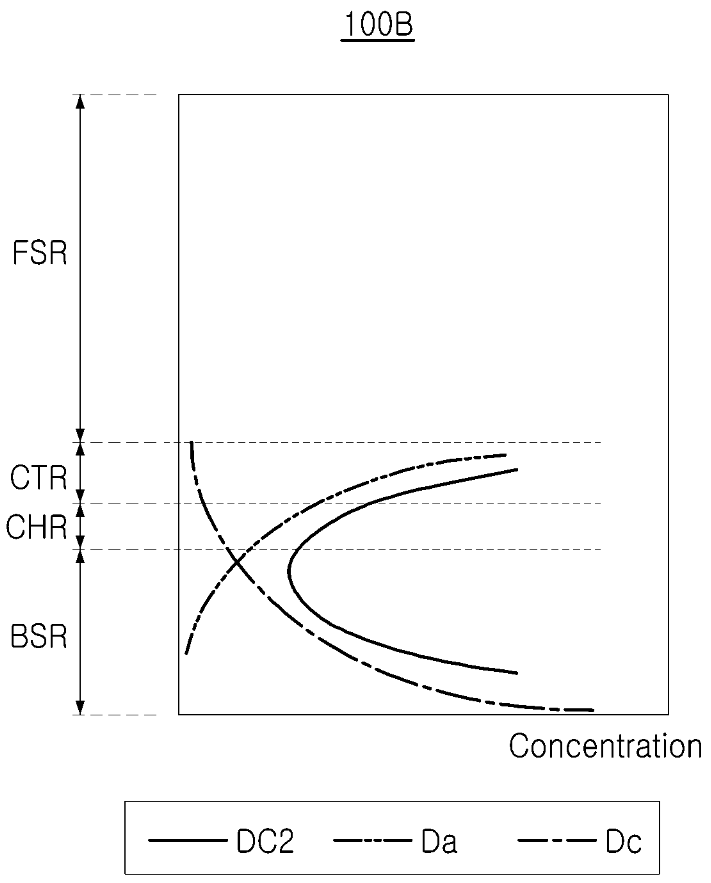
FIG. 5A is a concentration profile of a non-oxidizing material in a semiconductor device according to an embodiment of the present inventive concept.
Figure 5B:
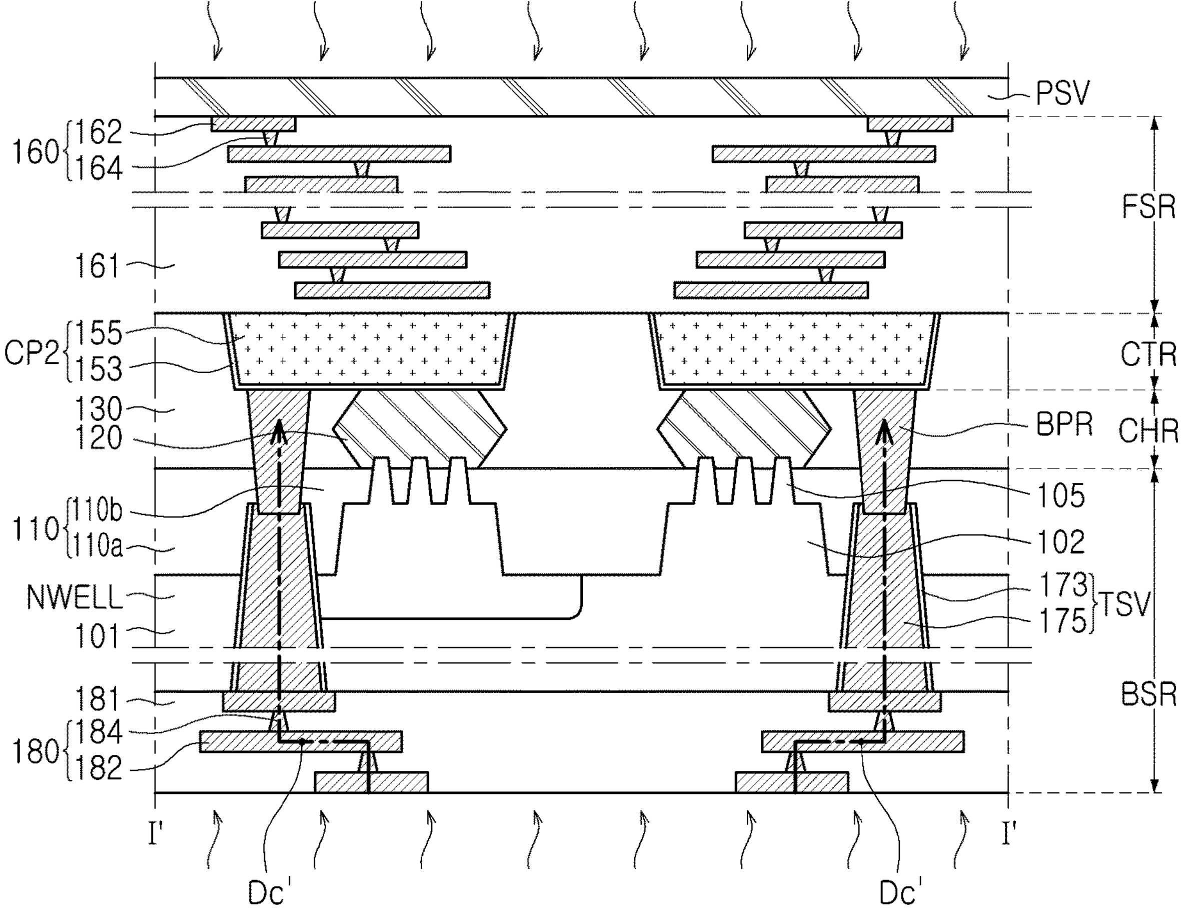
FIG. 5B is a cross-sectional view illustrating a manufacturing process of the semiconductor device having the concentration profile of FIG. 5A.

FIG. 5A is a concentration profile DC2 of a non-oxidizing material in a semiconductor device 100B according to an embodiment of the present inventive concept, and FIG. 5B is a cross-sectional view illustrating a manufacturing process of the semiconductor device 100B having the concentration profile DC2 of FIG. 5A.

Referring to FIGS. 5A and 5B, the semiconductor device 100B according to an embodiment may have the same or similar features as those described with reference to FIGS. 1 to 4B, except that a non-oxidizing material is not injected through a second path Db' and a non-oxidizing material is only injected through a first path Da' and a third path Dc'. The semiconductor device 100B may have a second concentration profile DC2 for a non-oxidizing material. According to the second concentration profile DC2, deuterium is included only in a target region CHR, a contact region CTR and a rear interconnection region BSR. The deuterium is not included in the front interconnection region FSR. A concentration of deuterium may increase towards an upper end of the contact region CTR and a lower end of the rear interconnection region BSR. The second concentration profile DC2 may be determined by a combination of a first preliminary concentration profile Da and a third preliminary concentration profile Dc. According to the second concentration profile DC2, the target region CHR may include a non-oxidizing material (e.g., hydrogen or deuterium) at a first concentration, and the rear interconnection region BSR may include a non-oxidizing material (e.g., hydrogen or deuterium) at a second concentration higher than the first concentration. The contact region CTR may include a non-oxidizing material (e.g., hydrogen or deuterium) at a third concentration higher than the first concentration. In an embodiment, the third concentration of the contact region CTR may be equal to or similar to the second concentration of the rear interconnection region BSR. In addition, the non-oxidizing material may be included in the lowest concentration on a level above or below the target region CHR. For example, in an embodiment as shown in FIG. 5A the second concentration profile DC2 of the non-oxidizing material may have one lowest concentration point located in the rear interconnection region BSR. However, embodiments of the present inventive concept are not necessarily limited thereto.

In a manufacturing method of the semiconductor device 100B according to an embodiment of the present embodiment as shown in FIG. 5B, a protective layer PSV covering an upper end of the front interconnection structure 160 may be introduced during a secondary high-pressure heat treatment process. In an embodiment, the protective layer PSV may include, for example, an oxide, nitride, or a combination thereof. However, a material of the protective layer PSV is not necessarily limited thereto. The protective layer PSV may prevent a non-oxidizing material from being injected through the front interconnection structure 160 in the secondary high-pressure heat treatment process, and may increase the concentration of the non-oxidizing material in the target region CHR.

Figure 6:
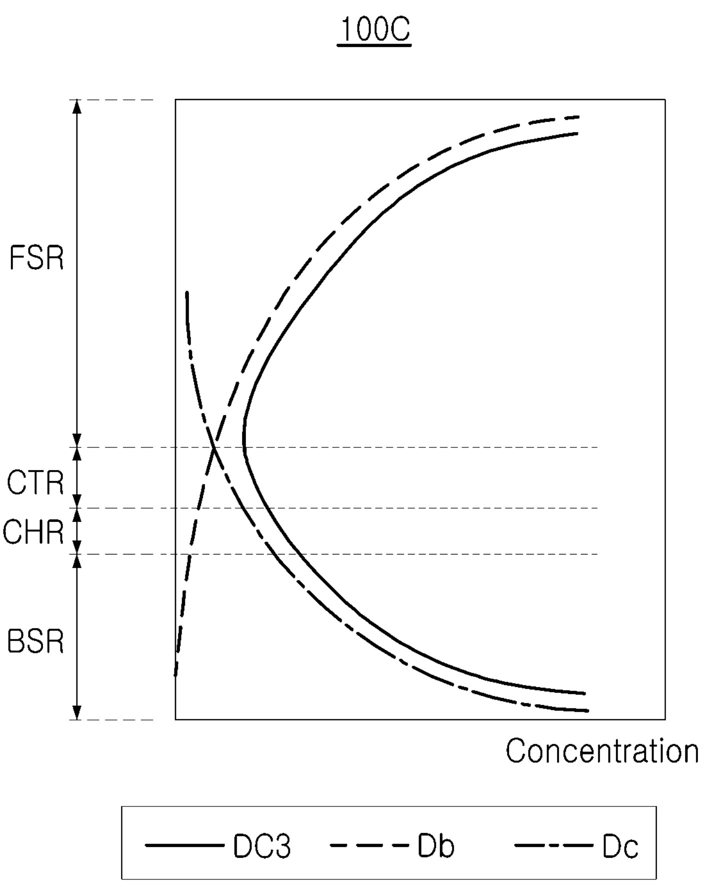
FIG. 6 is a concentration profile of a non-oxidizing material in a semiconductor device according to an embodiment of the present inventive concept.

FIG. 6 is a concentration profile DC3 of a non-oxidizing material in a semiconductor device 100C according to an embodiment of the present inventive concept.

Referring to FIG. 6, the semiconductor device 100C may have the same or similar features as those described with reference to FIGS. 1 to 5B, except that a non-oxidizing material is not injected through a first path Da'. In a manufacturing method of the semiconductor device 100C according to an embodiment, a primary high-pressure heat treatment process (see FIG. 4A) may be omitted, and only a secondary high-pressure heat treatment process (see FIG. 4B) may be included.

The semiconductor device 100C may have a third concentration profile DC3 for a non-oxidizing material. According to the third concentration profile DC3, deuterium is included in a target region CHR, a contact region CTR, a front interconnection region FSR and a rear interconnection region BSR, and a concentration of deuterium may increase towards an upper end of the front interconnection region FSR and increase towards a lower end of the rear interconnection region BSR. The third concentration profile DC3 may be determined by a combination of a second preliminary concentration profile Db and a third preliminary concentration profile Dc. According to the third concentration profile DC3, the target region CHR may include a non-oxidizing material (e.g., hydrogen or deuterium) at a first concentration, and the rear interconnection region BSR may include a non-oxidizing material (e.g., hydrogen or deuterium) at a second concentration, higher than the first concentration. The front interconnection region FSR may include a non-oxidizing material (e.g., hydrogen or deuterium) at a third concentration higher than the first concentration. In an embodiment, the third concentration of the front interconnection region FSR may be equal to or similar to the second concentration of the rear interconnection region BSR. The contact region CTR may include a non-oxidizing material at a concentration lower than the first concentration of the target region CHR. In addition, the non-oxidizing material may be included in the lowest concentration on a level above or below the target region CHR. For example, the third concentration profile DC3 may have one lowest concentration point located in the front interconnection region FSR. However, embodiments of the present inventive concept are not necessarily limited thereto. As described above, even when a primary high-pressure heat treatment process of injecting a non-oxidizing material into the contact region CTR, adjacent to the target region CHR is omitted, the non-oxidizing material may be sufficiently injected into the target region CHR through the rear interconnection region BSR.

Figure 7:
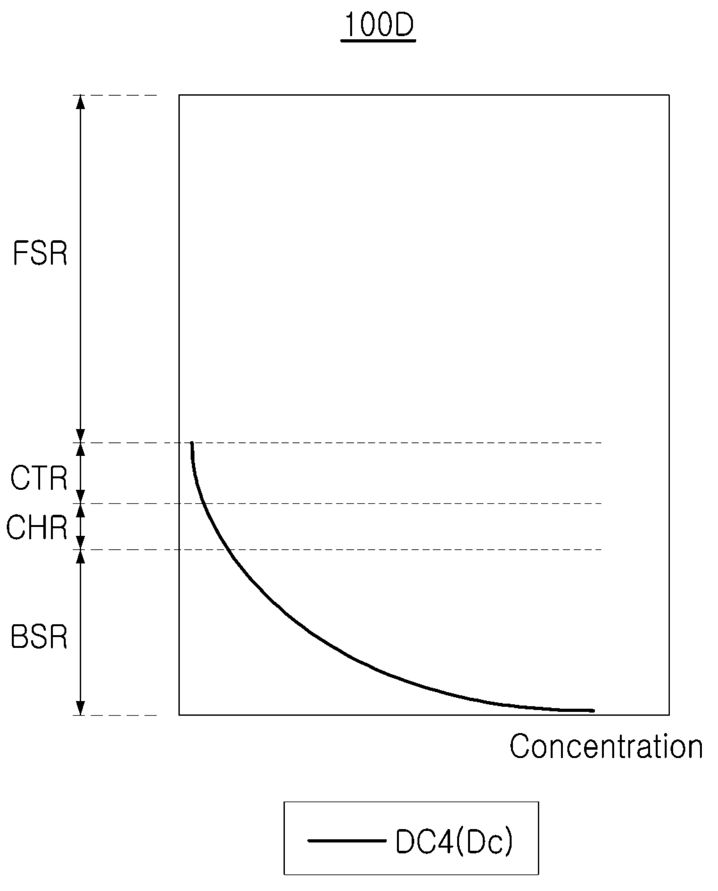
FIG. 7 is a concentration profile of a non-oxidizing material in a semiconductor device according to an embodiment of the present inventive concept.

FIG. 7 is a concentration profile DC4 of a non-oxidizing material in a semiconductor device 100D according to an embodiment of the present inventive concept.

Referring to FIG. 7, the semiconductor device 100D may have the same or similar features as those described with reference to FIGS. 1 to 6, except that a non-oxidizing material is not injected through a first path Da' and a second path Db'. In a manufacturing method of the semiconductor device 100D according to an embodiment, a primary high-pressure heat treatment process (see FIG. 4A) may be omitted, and a protective layer (PSV in FIG. 5B) may be introduced during a secondary high-pressure heat treatment process.

The semiconductor device 100D may have a fourth concentration profile DC4 for a non-oxidizing material. According to the fourth concentration profile DC4, deuterium is included only in a target region CHR, a contact region CTR, and a rear interconnection region BSR. Deuterium is not included in the front interconnection region FSR. A concentration of deuterium may decrease towards an upper end of the contact region CTR and increases towards a lower end of the rear interconnection region BSR. In an embodiment, the fourth concentration profile DC4 may be substantially the same as a third preliminary concentration profile Dc. According to the fourth concentration profile DC4, the target region CHR may include a non-oxidizing material (e.g., hydrogen or deuterium) at a first concentration, and the rear interconnection region BSR may include a non-oxidizing material (e.g., hydrogen or deuterium) at a second concentration that is higher than the first concentration. The contact region CTR may include a non-oxidizing material (e.g., hydrogen or deuterium) at a fifth concentration that is lower than the first concentration. In addition, the non-oxidizing material may be included in the lowest concentration on a level above the target region CHR. For example, the fourth concentration profile DC4 may have one lowest concentration point located in the contact region CTR. However, embodiments of the present inventive concept are not necessarily limited thereto. As described above, even when a primary high-pressure heat treatment process of injecting a non-oxidizing material into the contact region CTR, adjacent to the target region CHR is omitted, the non-oxidizing material may be sufficiently injected into the target region CHR through the rear interconnection region BSR.

Figure 8A:
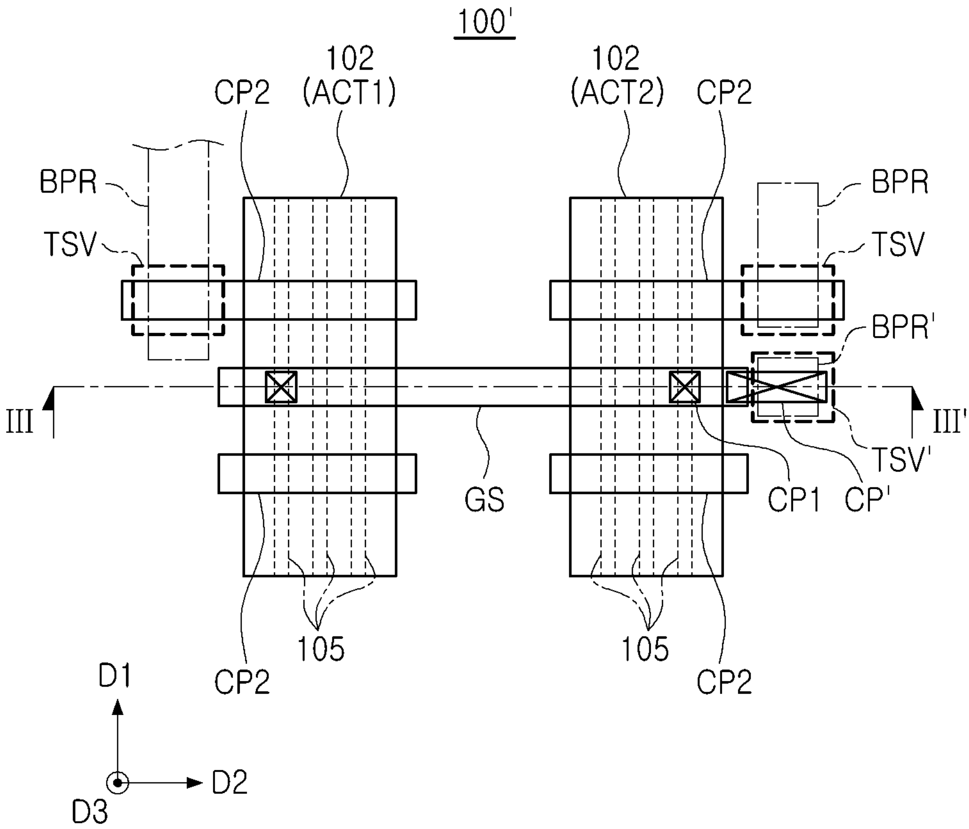
FIG. 8A is a layout diagram of a semiconductor device according to an embodiment.
Figure 8B:
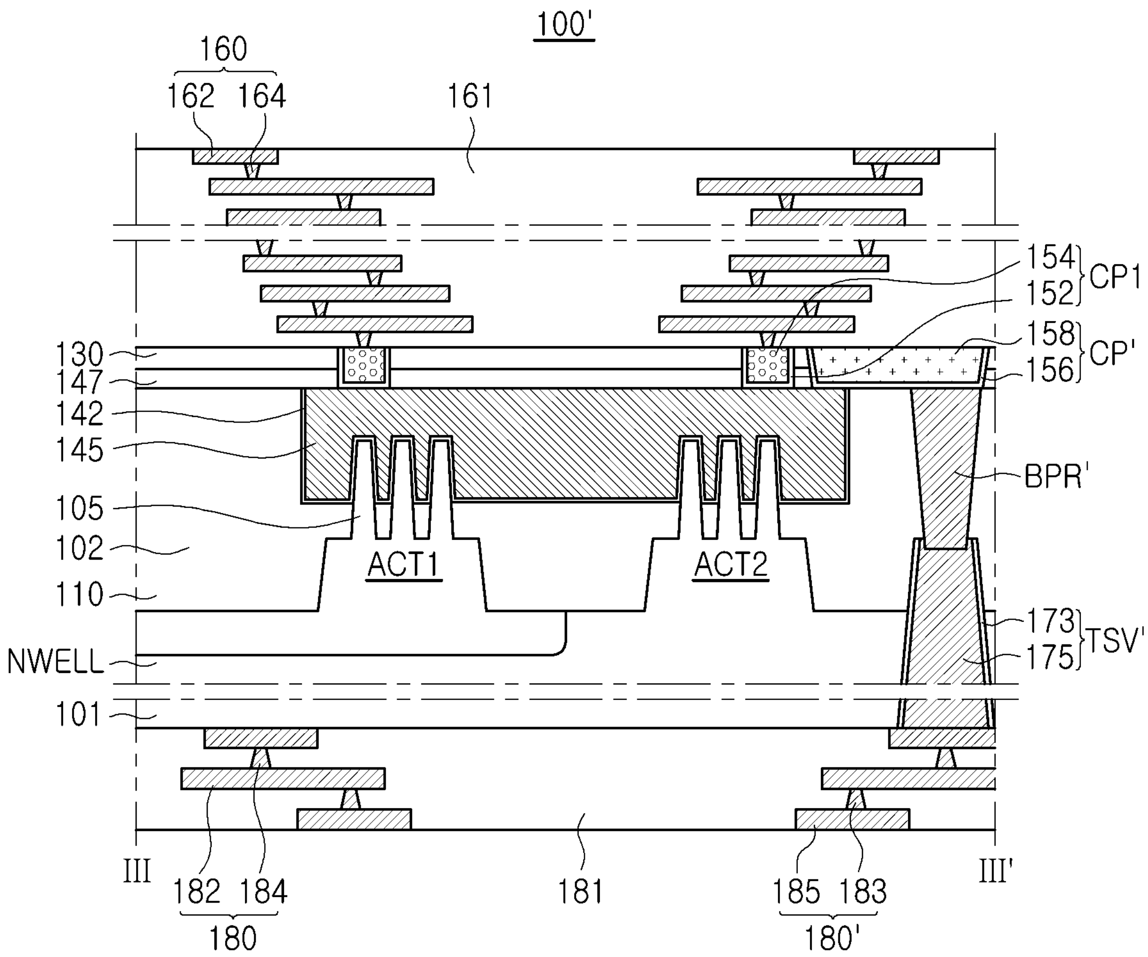
FIG. 8B is a cross-sectional view taken along line III-III' of FIG. 8A.

FIG. 8A is a layout diagram of a semiconductor device 100' according to an embodiment of the present inventive concept, and FIG. 8B is a cross-sectional view illustrating cross-sections of III-III' of FIG. 8A.

Referring to FIGS. 8A and 8B, the semiconductor device 100' according to an embodiment may have the same or similar features as those describe with reference to FIGS. 1 to 7, except for further including a dummy plug CP' and dummy through-structures BPR' and TSV'.

The dummy plug CP' may be disposed between a gate structure GS and a front interconnection structure 160 (e.g., in the third direction D3), and may be electrically connected to the gate structure GS. The dummy plug CP' may be electrically insulated from the front interconnection structure 160. The dummy plug CP' may be connected to the dummy through-structures BPR' and TSV' to form a non-oxidizing material injection path formed from a dummy interconnection structure 160' to the gate structure GS. In an embodiment, the dummy plug CP' may include a conductive dummy barrier 156 and a conductive dummy plug 158. The conductive dummy barrier 156 may include at least one material selected from Ti, TiN, Ta, or TaN. The conductive dummy plug 158 may include a conductive material, for example, a metal material such as tungsten (W), aluminum (Al), or copper (Cu), or a semiconductor material such as doped polysilicon.

The dummy through-structures BPR' and TSV' may extend in a vertical direction, and may electrically connect the dummy plug CP' and a dummy interconnection structure 180' to each other. In an embodiment, the dummy through-structures TSV' and BPR' may include, for example, dummy rails BPR' and dummy through vias TSV'. The dummy rail BPR' may be disposed between the dummy through via TSV' and the dummy plug CP', and may be spaced apart from the gate structure GS. In an embodiment, the dummy rail BPR' may include, for example, at least one compound selected from aluminum (Al), copper (Cu), and tungsten (W). The dummy through via TSV' may include a via plug 175 and a side barrier film 173. The via plug 175 may be formed of, for example, W, Mo, Ru, Nb, Hf, or a combination thereof. The side barrier film 173 may be formed of Ti, Ta, TiN, TaN, or a combination thereof. The dummy interconnection structure 180' may include dummy interconnection lines 185 and dummy vias 183. The dummy interconnection lines 185 and the dummy vias 183 may include at least one metal selected from, for example, W, Al, or Cu.

As set forth above, according to embodiments of the present inventive concept, a highly integrated and high-performance semiconductor device may be provided by injecting a non-oxidizing material using a rear interconnection structure.

While non-limiting embodiments have been shown and described above, it will be apparent to those skilled in the art that modifications and variations could be made without departing from the scope of the present inventive concept.

What is claimed is:

1. A semiconductor device, comprising:

a substrate having a front surface having an active region and a rear surface opposite to the front surface;

an active pattern extending in a first direction on the active region of the substrate;

a gate structure extending in a second direction on the active region of the substrate, the gate structure crossing the active pattern;

source/drain regions disposed on the active pattern on both sides of the gate structure;

a front interconnection structure disposed on the gate structure and the source/drain regions, the front interconnection structure is electrically connected to the gate structure;

a rear interconnection structure disposed on the rear surface of the substrate, the rear interconnection structure is electrically connected to the source/drain regions;

a first contact plug electrically connecting the gate structure and the front interconnection structure to each other;

a second contact plug disposed between the source/drain regions and the front interconnection structure, the second contact plug electrically connected to the source/drain regions; and a rear through-structure extending in a third direction perpendicular to the rear surface of the substrate, the rear through-structure electrically connecting the second contact plug and the rear interconnection structure to each other, wherein a target region defined by the source/drain regions and the active pattern includes a non-oxidizing material at a first concentration, the non-oxidizing material is injected during a high-pressure heat treatment process;

a rear interconnection region defined by the substrate, the rear through-structure, and the rear interconnection structure includes the non-oxidizing material at a second concentration higher than the first concentration.

2. The semiconductor device of claim 1, wherein the non-oxidizing material comprises hydrogen or deuterium.

3. The semiconductor device of claim 1, wherein a concentration profile of the non-oxidizing material along the third direction has at least two inflection points.

4. The semiconductor device of claim 3, wherein:

a first low-concentration point of the non-oxidizing material is located in a front interconnection region defined by the front interconnection structure; and a second low-concentration point is located in the target region or in a contact region defined by the second contact plug and disposed between the target region and the rear interconnection region.

5. The semiconductor device of claim 1, wherein a concentration of the non-oxidizing material increases or decreases between the first concentration and the second concentration.

6. The semiconductor device of claim 1, wherein a front interconnection region defined by the front interconnection structure comprises the non-oxidizing material at a third concentration that is higher than the first concentration.

7. The semiconductor device of claim 1, wherein the non-oxidizing material is included only in the rear interconnection region, the target region, and a contact region defined by the second contact plug.

8. The semiconductor device of claim 7, wherein the contact region comprises the non-oxidizing material at a fourth concentration that is higher than the first concentration.

9. The semiconductor device of claim 7, wherein the contact region comprises the non-oxidizing material at a fifth concentration that is lower than the first concentration.

10. The semiconductor device of claim 1, wherein:

the rear through-structure comprises a through-via penetrating the substrate and extending in the third direction; and a buried power rail is disposed between the through-via and the second contact plug.

11. The semiconductor device of claim 10, wherein the buried power rail extends in the first direction.

12. The semiconductor device of claim 1, wherein the second contact plug is spaced apart from the front interconnection structure.

13. The semiconductor device of claim 12, further comprising:

a front dielectric layer surrounding the front interconnection structure, the front dielectric layer is disposed between the second contact plug and the front interconnection structure, wherein the second contact plug and the front interconnection structure are electrically insulated from the front dielectric layer.

14. The semiconductor device of claim 1, further comprising:

a rear dielectric layer surrounding the rear interconnection structure.

15. The semiconductor device of claim 1, wherein:

the active pattern comprises an active fin protruding from the active region in the third direction, wherein the gate structure comprises a gate electrode crossing the active pattern and extending in the second direction, and a gate insulating film disposed between the gate electrode and the active pattern.

16. The semiconductor device of claim 1, further comprising:

a plurality of channel layers arranged on the active pattern, the plurality of channel layers are spaced apart from each other in the third direction, and extend in the first direction, respectively, wherein the gate structure includes gate electrode layers respectively disposed below the plurality of channel layers, and a gate insulating layer disposed between the plurality of channel layers and the gate electrode layers and between the active pattern and the gate electrode layers.

17. The semiconductor device of claim 1, further comprising:

a dummy plug disposed between the gate structure and the front interconnection structure, the dummy plug is electrically connected to the gate structure; and a dummy through-structure extending in the third direction, the dummy through-structure electrically connects the dummy plug and a dummy interconnection structure to each other.

18. A semiconductor device, comprising:

a substrate having an active region;

an active pattern on the active region of the substrate;

a gate structure on the active region of the substrate, the gate structure crossing the active pattern;

source/drain regions on the active pattern on both sides of the gate structure;

a buried power rail disposed on the substrate, the buried power rail is spaced apart from the source/drain regions;

a contact plug disposed on the source/drain regions, the contact plug electrically connects the source/drain regions and the buried power rail to each other; and a rear interconnection structure disposed below the substrate, the rear interconnection structure is electrically connected to the buried power rail, wherein a concentration of deuterium increases towards a lower end of a rear interconnection region defined by at least a portion of the substrate and the rear interconnection structure, the deuterium is injected during a high-pressure heat treatment process.

19. The semiconductor device of claim 18, wherein the concentration of deuterium has a lowest concentration above or below a target region defined by the source/drain regions and the active pattern.

20. A semiconductor device, comprising:

a substrate having an active region;

an active pattern on the active region of the substrate;

a gate structure on the active region of the substrate, the gate structure crossing the active pattern;

source/drain regions on the active pattern on both sides of the gate structure;

a front interconnection structure disposed on the gate structure and the source/drain regions, the front interconnection structure is electrically connected to the gate structure;

a first contact plug electrically connecting the gate structure and the front interconnection structure to each other;

a buried power rail disposed on the substrate, the buried power rail is spaced apart from the source/drain regions;

a rear interconnection structure disposed below the substrate, the rear interconnection structure is electrically connected to the buried power rail; and a second contact plug disposed on the source/drain regions, the second contact plug electrically connecting the source/drain regions and the buried power rail to each other, wherein deuterium is included in a target region defined by the source/drain regions and the active pattern, a rear interconnection region defined by the rear interconnection structure, a contact region defined by the second contact plug, and a front interconnection region defined by the front interconnection structure, the deuterium is injected during a high-pressure heat treatment process, wherein a concentration of the deuterium increases towards an upper end of the front interconnection region and a lower end of the rear interconnection region.

* * * * *